(12) United States Patent
Abbaszadeh et al.

(10) Patent No.: US 8,065,585 B1
(45) Date of Patent: Nov. 22, 2011

(54) HIGH DATA THROUGHPUT TURBO PRODUCT ENCODER

(75) Inventors: Ayyoob Abbaszadeh, Salt Lake City, UT (US); David Todd Wilstead, West Valley, UT (US)

(73) Assignee: L-3 Communications Corporation, New York, NY (US)

( * ) Notice: Subject to any disclaimer, the term of this patent is extended or adjusted under 35 U.S.C. 154(b) by 1083 days.

(21) Appl. No.: 11/897,367

(22) Filed: Aug. 30, 2007

(51) Int. Cl.
 *H03M 13/00* (2006.01)
(52) U.S. Cl. ..................................................... 714/752
(58) Field of Classification Search .................. 714/752, 714/755, 786
 See application file for complete search history.

(56) References Cited

U.S. PATENT DOCUMENTS

| | | | | |
|---|---|---|---|---|
| 6,581,178 B1 * | 6/2003 | Kondo | ........................... | 714/758 |
| 6,622,277 B1 * | 9/2003 | Ramanujam et al. | ......... | 714/755 |
| 7,246,294 B2 * | 7/2007 | Kauschke et al. | ............ | 714/755 |
| 2003/0188248 A1 * | 10/2003 | Kauschke et al. | ............ | 714/755 |

* cited by examiner

*Primary Examiner* — Phung M Chung
(74) *Attorney, Agent, or Firm* — Harrington & Smith

(57) ABSTRACT

A source controller provides a block of n×a information bits as n separate rows each with a information bits. A row encoder has an input coupled to an output of the source controller and includes a plurality of accumulators arranged to process m of the information bits in one clock cycle to generate row forward error correction FEC bits. At least one column encoder has an input coupled to an output of the source controller and is arranged to generate column FEC bits in parallel with the row encoder. A multiplexer is coupled to outputs of the row and column encoders and is adapted to serially output an $n^{th}$ row of information bits followed by the $n^{th}$ row FEC bits for each of the n rows, followed by additional rows of FEC bits generated by the column encoder. The terms n, m, and a are integers greater than one. Where more than one column encoder is used, there are preferably m column encoders in parallel and each operating at one bit per clock cycle.

24 Claims, 12 Drawing Sheets a COLUMNS    b COLUMNS

| | | | | $P_H$ | $P_H$ | $P_H$ | $P_H$ |
|---|---|---|---|---|---|---|---|
| I | I | I | I | $P_H$ | $P_H$ | $P_H$ | $P_H$ |
| I | I | I | I | $P_H$ | $P_H$ | $P_H$ | $P_H$ |
| I | I | I | I | $P_H$ | $P_H$ | $P_H$ | $P_H$ |
| I | I | I | I | $P_H$ | $P_H$ | $P_H$ | $P_H$ |
| $P_V$ | $P_V$ | $P_V$ | $P_V$ | $P_{VH}$ | $P_{VH}$ | $P_{VH}$ | $P_{VH}$ |
| $P_V$ | $P_V$ | $P_V$ | $P_V$ | $P_{VH}$ | $P_{VH}$ | $P_{VH}$ | $P_{VH}$ |
| $P_V$ | $P_V$ | $P_V$ | $P_V$ | $P_{VH}$ | $P_{VH}$ | $P_{VH}$ | $P_{VH}$ |
| $P_V$ | $P_V$ | $P_V$ | $P_V$ | $P_{VH}$ | $P_{VH}$ | $P_{VH}$ | $P_{VH}$ | n ROWS (top 4 rows), c ROWS (bottom 4 rows)

FIG.1
PRIOR ART

| | 102 PRESENT STATE | 104 NEXT STATE A0 ARRIVES | 106 NEXT STATE A1,A0 ARRIVES / NEXT STATE A1 ARRIVES | 108 NEXT STATE A2 ARRIVES | 110 NEXT STATE A3,A2,A,A0 ARRIVES / NEXT STATE A3 ARRIVES |
|---|---|---|---|---|---|
| A | P0 | P6+A0 | P5+A1 | P4+A2 | P3+A3 |
| B | P1 | P0 | P6+A0 | P5+A1 | P4+A2 |
| C | P2 | P1 | P0 | P6+A0 | P5+A1 |
| D | P3 | P2+P6+A0 | P1+P5+A1 | P0+P4+A2 | P6+P3+A0+A3 |
| E | P4 | P3 | P2+P6+A0 | P1+P5+A1 | P0+P4+A2 |
| F | P5 | P4 | P3 | P2+P6+A0 | P1+P5+A1 |
| G | P6 | P5 | P4 | P3 | P2+P6+A0 |
| | | m=1 | m=2 | m=3 | m=4 |

FIG.5

120 — New_Row='1' When CCT=49 or 63
148 — New_Code='1' When RCT=126 Or
         RCT=125 & CCT <14
150 — CCT_Zero='1' When CCT=0
152 — RCT_Zero='1' When RCT=0
139 — RWAIT ='1' When CCT<4
138 — CWAIT ='1' When RCT<8
146 — EOB='1' When
         RCT_Zero='1' & CCT_Zero='1'
116 — DACK='0' When
(RWAIT='1' OR CWAIT='1') AND not(EOB)

US 8,065,585 B1

HIGH DATA THROUGHPUT TURBO PRODUCT ENCODER

TECHNICAL FIELD

The teachings detailed herein relate to forward error correction such as by turbo product encoders and decoders that may be advantageously employed in digital communications.

BACKGROUND

Forward error correction FEC is a powerful tool to increase power and spectrum efficiency, especially in wireless communications. Turbo product codes TPCs are a class of FEC codes that define a relatively large code from smaller block codes. FIG. 1 is a simplified example of a full TPC block, where I indicates an information bit (payload) and P indicates a parity bit (error correction). Each of the rows or columns may be considered a (8,4) Hamming Code, where the parenthetical indicates (codeword length, information bits per codeword). This code takes 4 information bits, computes 3 parity bits of Hamming Code, and one additional parity bit of all the 4 information bits and the 3 Hamming code parity bits to create an 8-bit code word. That one additional parity bit in the codeword is termed an extended parity bit, because as will be seen it is computed differently than other parity bits. Each bit in the final row and column of FIG. 1 is an extended parity bit. In systematic form a code word has the form: $I_1 I_2 I_3 I_4 P_1 P_2 P_3 P_4$. Here the symbol $I_j$ denotes information bit, and $P_1$ through $P_3$ denote parity bits generated by the Hamming Code, and $P_4$ denotes an extended parity bit for all 7 bits (the entire codeword except for the an extended parity bit).

A traditional TPC encoder starts with the first row of information bits, calculates and appends the parity bits, denoted $P_H$ (horizontal parity), and then moves to the second row. This is repeated for each row. Next, that TPC encoder starts with the first column of information bits, calculates and appends the parity bits for the column, denoted by $P_V$ (vertical parity), and moves to the next column. Those bits designated $P_{VH}$ are termed parity on parity bits, because they represent parity of only other parity bits, and are not generated directly from any information bit(s). It is important to note three items: a) the parity on parity bits $P_{VH}$ can be generated as row parities or column parities and in both cases the result is the same parity bit patterns, i.e. $P_{VH}=P_{HV}$; b) different code lengths may be used for the horizontal and vertical blocks; and c) the illustrated two-dimensional TPC code may be expanded to three dimensions. For this two dimensional code, the encoder operates on both rows and columns, so the encoding process is $(8,4)^2$ to generate a rate ¼ code. Typical TPC codes employ a higher coding rate, as will be seen in the example used hereafter.

The architecture of a traditional TPC encoder 20 is shown in FIG. 2, and the related timing diagram is shown in FIG. 3. These figures are described in the context of a two dimensional code that has a (128,120) extended single error correcting BCH code or equivalently an extended Hamming code as both its row and column codes. A BCH (Bose, Ray-Chaudhuri, Hocquenghem) code is a multi-level, cyclic error-correcting code used to correct random error. A Hamming code is a special case of a (single-error correcting) BCH code and is used herein as a non-limiting example.

As will be seen, the extended parity bits are computed separately in the encoder. Considering a codeword with 120 information bits and the 7 normally-computed parity bits, the generator function of the single error correcting (127,120) BCH code with Hamming distance of 4 is $g(x)=X^7+X^3+1$, or (010001001), or $(211)_8$. This generator function is implemented with a 7-bit length linear feedback shift register LFSR 22 for the first seven parity bits (P6→P0) as shown in FIG. 2, using a one-bit accumulator 24 for each parity bit and an adder 25 interspersed to tap different information bits at different clock cycles to assure each resulting parity bit P0-P6 in the codeword represents a different combination. This LFSR 22 is reset at the beginning of an arriving new codeword. Each codeword has 120 information bits fed into the encoder 20 along a Data_in line 26. The encoder is a systematic encoder and hence the first 120 bits of the codeword output on the Data_out line 28 equals the first 120 information bits arriving along the Data_in line 26. The first information bit A0 is also input to the LFSR 22 at the adder 25. Each of the next information bits A1, A2, A3, . . . A119 from the Data_in line 26 move incrementally through the seven-bit length LFSR 22 At that time, signal line S1 30 switches a first multiplexer 32 to receive inputs from the LFSR 22 rather than the Data_in line 26, and the seven parity bits P6-P0 from the LFSR 22 append to the end of the 120 information bits A119-A0. Throughout, each and every bit is fed into an extended parity register 34 of bit-length one. Once the final LFSR 22 parity bit P0 is output from the first multiplexer 30, a signal S0 36 changes the input of a second multiplexer 38 from the first multiplexer 32 to the extended parity register 34, and the final parity bit PP is appended to follow the seven LFSR 22 parity bits P6-P0, thus completing the row-codeword output on the Data_out line 28.

The columns are encoded with the same hardware, but with one information or parity bit from each row input into the encoder 20 to generate the parity bits for that column. The row-outputs of the FIG. 2 encoder 20 may be stored in a RAM and then re-input as column information bits along the Data_in line 26. The information bits after the column encoding are the same ones output from the row encoding and stored in memory, so they may be handled in two ways: they may be output and overwrite those corresponding information bits stored in the RAM from the various row encoding processes, or they may be deleted without being output from the column encoding process so that only the column parity bits are output from the column encoding process to the RAM. As noted above, the $P_{VH}$ bits may be computed as columns or rows. As with the information bits in column encoding, the $P_V$ or $P_H$ bits from the RAM that are used to generate the $P_{VH}$ bits may be deleted before being output from the $P_{VH}$ generation process, or may be re-entered into the RAM to overwrite their corresponding $P_V$ or $P_H$ values already in RAM from the previous row or column encoding process.

FIG. 3 shows the timing diagram for encoding one row by the encoder 20 of FIG. 2 in view of the clock pulses 40, with one-bit processing. The New_Row signal 42 resets the accumulators 24 for all eight parity bits P6-P0 and PP to initiate a new row codeword. Each information bit A119-A0 input on the Data_in line 26 moves one position on each clock pulse until all information bits of the block are input. At that point, signal S1 30 goes high, suspending entry of the next row of information bits of the block while the parity bits P6-P0 are output from the LFSR 22. Signal S0 36 then goes high to output the extended parity bit PP. The individual output bits for a single row are seen at the Data-out line 28, one bit per clock cycle. Each row is generated in that manner, and thereafter the column parity bits are generated using the same encoder hardware 20 by either of the methods noted above.

This invention improves upon the described prior art architecture in hardware and speed, as will be detailed below.

SUMMARY

The foregoing and other problems are overcome, and other advantages are realized, in accordance with the presently described embodiments of these teachings.

In accordance with an exemplary embodiment of the invention, there is provided a method for encoding information bits. Consider an input series of n×a information bits. In the method, for one of all of the n rows or all of the a columns of the block, a first set of forward error correction FEC bits is computed by processing m information bits in a clock cycle, and each $n^{th}$ row or $a^{th}$ column is multiplexed with the first set of FEC bits computed for that $n^{th}$ row or $a^{th}$ column. For the other of all of the n rows or all of the a columns, a second set of FEC bits is computed by processing one bit per clock cycle in each of m parallel encoding processes. A third set of FEC bits is computed from either the first or second set of FEC bits and the second and third sets of FEC bits are multiplexed. Then is output serially each of the n rows or a columns multiplexed with the first set of FEC bits and the multiplexed second and third sets of FEC bits. The terms n, a and m are integers greater than one.

In accordance with another exemplary embodiment of the invention, there is provided an encoder that includes a source controller, a row encoder, a plurality of m column encoder, first, second and third multiplexers, and a local memory. The source controller has an output configured to output a n×a series of information bits as n separate rows each with a information bits. The row encoder has an input coupled to the source controller output, and is configured, for each of the n rows, to compute a first set of forward error correction FEC bits by processing m information bits of a row in a clock cycle. The first multiplexer is configured to multiplex each $n^{th}$ row of information bits with the first set of FEC bits for the $n^{th}$ row that are output by the row encoder. The plurality of m column encoders are in parallel with one another, and each is coupled to the source controller output through a switch. The column encoders are configured, for each of the a columns, to compute a second set of FEC bits by each processing one bit per clock cycle, and to generate a third set of FEC bits from the second set of FEC bits. The local memory has an input coupled to outputs of the m column encoders and an output coupled to inputs of the m column encoders for storing and feeding back interim FEC bits and for storing the second and third sets of FEC bits. The second multiplexer has an input coupled to the output of the local memory and is configured to multiplex the second and third sets of FEC bits. The third multiplexer has inputs coupled to outputs of the first and second multiplexers and is configured to output serially each of the n rows multiplexed with the first set of FEC bits and the multiplexed second and third sets of FEC bits. The terms n, a and m are integers greater than one.

In accordance with another exemplary embodiment of the invention, there is provided an encoder that includes a source controller for providing a block of n×a information bits as n separate rows each with a information bits. The encoder further includes a row encoder having an input coupled to an output of the source controller and including a plurality of accumulators arranged to process m of the information bits in a clock cycle to generate row forward error correction FEC bits. There is also at least one column encoder having an input coupled to an output of the source controller and arranged to generate column FEC bits in parallel with the row encoder. A multiplexer is coupled to outputs of the row and column encoders and is adapted to serially output an $n^{th}$ row of information bits followed by the $n^{th}$ row FEC bits for each of the n rows, followed by additional rows of FEC bits generated by the column encoder. As above, the terms n, m, and a are integers greater than one, but in this embodiment there may be only one column encoder.

Further details as to various embodiments and implementations are detailed below.

BRIEF DESCRIPTION OF THE DRAWINGS

The foregoing and other aspects of these teachings are made more evident in the following Detailed Description, when read in conjunction with the attached Drawing Figures, wherein:

FIG. 1 is a prior art table of a turbo product code made from (8,4) codewords.

FIG. 5 is a chart where each sequential column shows a next sequential clock cycle state of the parity bit registers P0 through P6 of FIG. 2.

DETAILED DESCRIPTION

Figure 4:
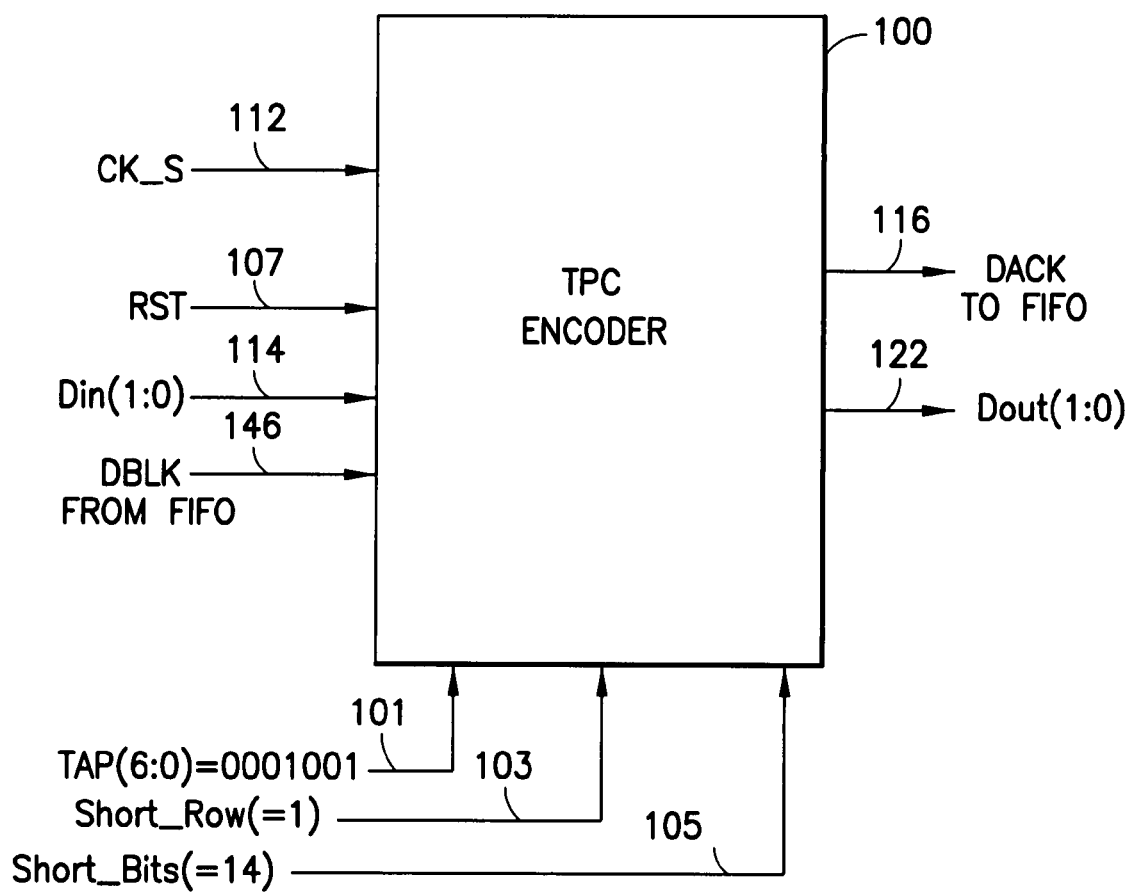
FIG. 4 is a schematic diagram showing an encoder module according to an embodiment of the invention and the various input and output signal lines to give context to other drawing Figures.

FIG. 4 illustrates a block diagram of an integrated circuit embodying the TPC encoder 100 according to an aspect of the invention. Various input and output signal lines are shown, as will be detailed with reference to other figures that detail specific internal operations of the TPC encoder 100 in order to put those other Figures in perspective relative to the entire encoder 100. The TAP signal 101, short row signal 103, and short bits signal 105 are control signals that may be input in order to tailor the encoder 100 to a specific TPC code, as will be detailed below. The RST 107 (reset) signal reset various counters/registers so that a new TPC code may be applied, rather than re-applying a previous TPC code used on a previous block of information bits to a new block of information bits.

In accordance with an aspect of the invention, the row and column encoders operate in harmony to create a shortened encoding process to generate TPC codewords. Consider that the encoder of FIG. 2 exhibits no parallelism because the rows and columns are encoded with the same single LFSR 22, as detailed above with rows first and thereafter columns. For a level of parallelism of one (LOP=m=1), one bit of the codeword is generated/advanced for one clock pulse and there is m=1 column encoder in parallel with one row encoder. For any LOP=m design apparatus, there will be m such single-bit column encoders and an m-bit at a time row encoder. Equivalently, there may be a single column encoder operating on m bits per clock and m single-bit row encoders, but the examples detailed below are in the context of one m-bit at a time row encoder and m one-bit at a time column encoders, each of which operates in parallel. Embodiments of this invention operate with a level of parallelism LOP=m, where m is an integer greater than or equal to one, each level representing m bits of the codeword advancing through the row encoder on a single clock pulse and m column encoders operating at one bit per cycle (or equivalently m bits advancing through a column encoder on a single clock cycle and m row encoders operating at one bit per clock cycle). For m=1, both row and column encoders operate in parallel at one bit per cycle and some efficiencies are gained over the prior art. In the example (128, 120) code detailed above, LOP>1 results in an encoding process significantly shorter than $(128, 120)^2$. Comparing the implementation of FIG. 6 for m=2, only half as many clock cycles are needed as compared to the single bit case of FIG. 3. Similarly for LOP=4, only 120/4=30 clock cycles are needed to input a single row of 120 information bits. Information bits are referenced as A0, A1, A2, etc. Note that while the invention is described in terms of parity bits, the teachings herein apply equally to other types of forward error correction FEC bits also.

First is provided an overview with reference to the overall TPC code of FIG. 1. Consider there to be n rows of information bits I in a TPC block, and for each row is generated a same number b of row parity bits. These may include the extended parity bit at the tail end of each row but need not. Some controller over the source of the information bits, such as a row counter, controls input of the information bits into a row encoder as separate rows. One or more row encoders process multiple bits per clock cycle to generate the row parity bits $P_H$. This generates the row codewords that in FIG. 1 are represented as a row of I bits (numbering a) followed by a series of $P_H$ bits (numbering b). Though one row encoder is described in detail below, two or more may be disposed in parallel using a bit-selective switch similar to that described for porting the input information bits to multiple column encoders.

For each $n^{th}$ row of information bits, at least one but advantageously two or more column encoders, operating in parallel with one another and with the row encoder, generate the column FEC/parity bits $P_V$ that form another row of the overall TPC code. Where there is more than one column encoder, the column encoders generate different ones of the $P_V$ bits for the same additional row. Call this other row an additional codeword. For simplicity, consider only one additional codeword for the moment, though the process for generating column FEC bits may be iterated to generate multiple "additional" codewords of $P_V$ bits (the $P_{VH}$ bits will be described later) that may or may not square the overall TPC code as seen in FIG. 1. For convention and with reference to FIG. 1, consider that each information bit I is disposed at an $a^{th}$ position of an $n^{th}$ row, and the resulting (a+b) by (n+c) encoded block is formed from a series of a×n input information bits input serially. A column then is those information bits I that are aligned in the same $a^{th}$ position of the various rows. One may or may not use all n rows to generate each $P_V$ bit of the additional codeword in a $c^{th}$ row, so any $c^{th}$ codeword made from column parity bits $P_V$ may be generically referred to as being generated from information bits at an $a^{th}$ position from at least two of the n rows. For one of the $a^{th}$ positions/columns of the at least two rows, a first column encoder generates a column parity bit $P_V$ for that one "additional" codeword, which lies in the $c^{th}$ row. For a different one of the $a^{th}$ positions/columns of the at least two rows, a second column encoder may be used to generate another column FEC bit for that same one "additional" codeword lying in the same $c^{th}$ row. For simplicity, two column encoders are described as operating in parallel, though there may be a or even a+b column encoders in parallel (each generating only one of the a or a+b column parity bits for an individual $P_V$ codeword in a $c^{th}$ row) or some number between two and a+b (where at least one column encoder would generate more than one column parity bit for an individual $P_V$ codeword). A practical upper limit is a column encoders, as little time is lost by generating the $P_{VH}$ bits in the row encoder or in the 2-to-a column encoders.

As will be described below, the column encoders operate to generate interim bits that do not form any part of the final TPC block. These interim bits are stored in a temporary memory, and enable the same information bit I to be input to the row encoder and to the column encoder appropriate for that information bit simultaneously, rather than inputting columns of information bits to a column encoder in an uninterrupted series. As the next $a^{th}$ bit of another $n^{th}$ information-bit row is input to the row encoder, it is also input to the column encoder which determines parity from that $a^{th}$ information bit of the $n^{th}$ information-bit row and the temporarily stored interim bit. Where there are more than one c rows of additional codewords, at times that interim bit may be the parity bit $P_V$ from a previous $c^{th}$ row, but in that instance the parity bit $P_V$ that forms a part of the $c^{th}$ codeword is output with the $c^{th}$ codeword (or elsewhere stored for that purpose when the $P_{VH}$ bits have not yet been generated) prior to being overwritten in the temporary memory.

The same process used to generate the column parity bits $P_V$ from the information bits I is used to generate the parity-on-parity bits $P_{VH}$ from the row parity bits $P_H$. That is, row parity bits $P_H$ in corresponding $a^{th}$ positions of various rows can be processed through one or both of the column encoders to generate a number b of the $P_{VH}$ bits. For this reason, the information bits I are not equally distributed for processing among two column encoders: one generates more $P_V$ bits and the other generates more (or all) of the $P_{VH}$ bits, but overall the computational load is distributed among them.

Now the output is generated. The n row codewords (from the row encoder), which are the a information bits I appended with the corresponding b row parity bits $P_H$ for each of the n rows, are multiplexed with the additional codeword (from the column encoders) which is the a column parity bits $P_V$ appended with the b parity on parity bits $P_{VH}$. The extended parity bits, representing the last column and row of the overall TPC code, may be processed similarly from the row/column perspective, though within each of the row and column encoders that generate them they are processed differently than the other $P_H/P_V/P_{VH}$ bits. As seen in FIG. 1, there may be c>1 codewords of parity-only bits ($P_V$ and $P_{VH}$ but no information bits).

Now embodiments of the invention are described with more particularity.

Figure 7:
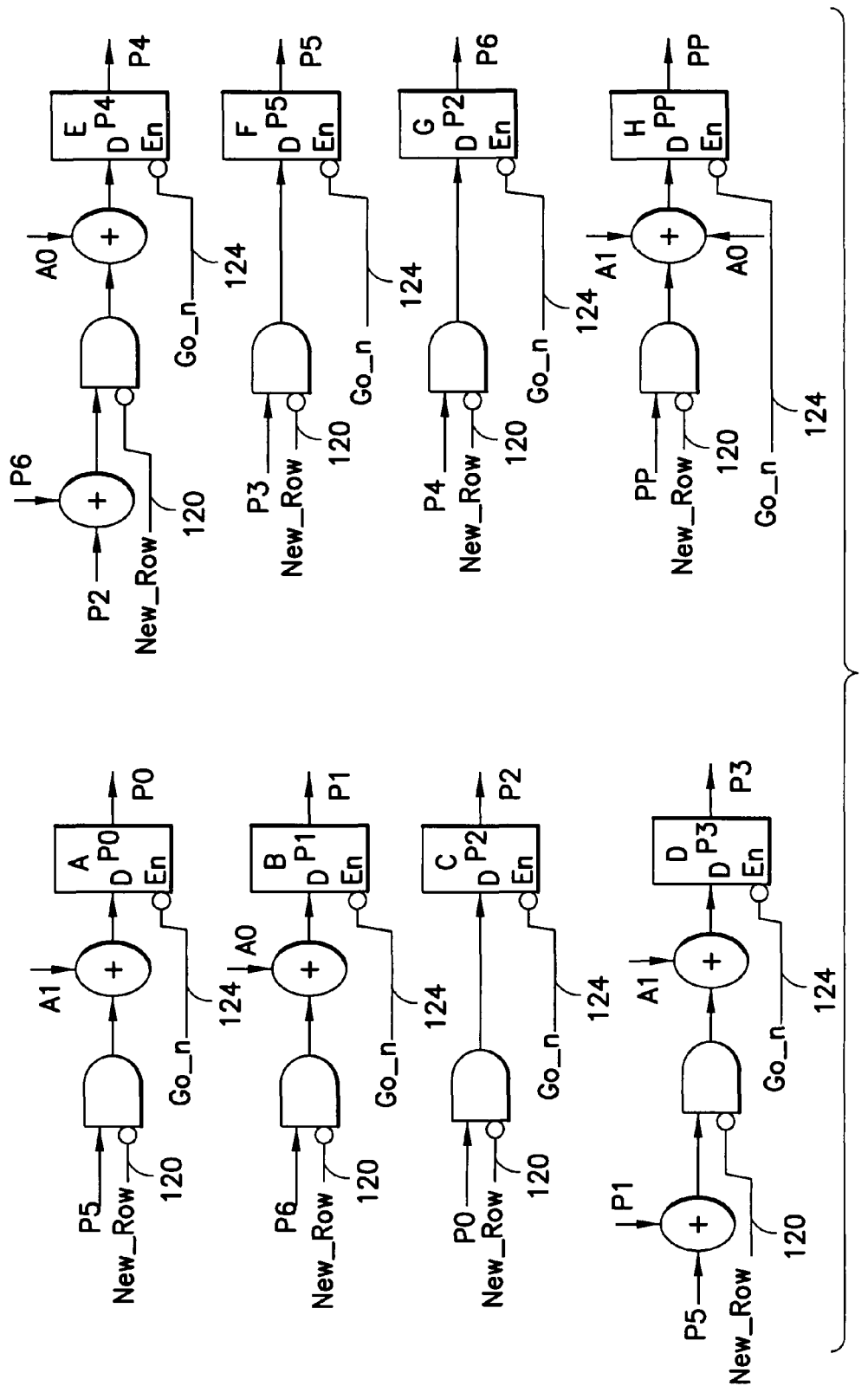
FIG. 7 is a series of registers for generating parity bits in a linear feedback shift register, showing inputs and outputs to implement a row encoder according to the third column of FIG. 5 and an embodiment of the invention.

State transitions of an LFSR with the present state of (P6, P5, . . . , P1, P0) in the various registers/accumulators to various new states when 1, 2, 3, and 4-inputs of (A3, A2, A1, A0) simultaneously arrive to the encoder are shown in FIG. 5. Each row represents one register, designated Accumulator A, B, C, etc. to avoid confusion with the values P0, P1, P2 etc. stored in those accumulators. Since at any time the state (P6→P0) of the encoder accumulators are known, the next states can be easily implemented according to the current contents (P6→P0) of the accumulators and the values of the appropriate information bits (A3, A2, A1, A0). This is shown at FIG. 5, where each column shows a next subsequent state of each register/accumulator for the first seven parity bits (P6→P0). A LOP=2 encoder is designed to receive the inputs of the second column of FIG. 5; a LOP=3 receives inputs according to the tliird column; a LOP=4 according to the fourth column, etc. The specific accumulators (registers) A-G for a LOP=2 implementation for the example (128, 120) extended BCH code are shown at FIG. 7. It is notable that an encoder design with LOP=m>=1 does not require m copies of the same encoder. The number of registers/accumulators in the LFSR is identical for all values of m; the primary difference is the next state decoder as m changes, which is shown in FIG. 5 for m=1, 2, 3, and 4.

The present state column 102 of FIG. 5 indicates the parity values P0 through P6 in the various registers A through G, which upon a reset signal are set to zero. Note that in FIG. 5, the value from one accumulator shifts to the next accumulator in the next column along a diagonal that moves downward toward the right. Due to the adder 25 at FIG. 2, movement from accumulator C to accumulator D adds additional bits.

Figure 2:
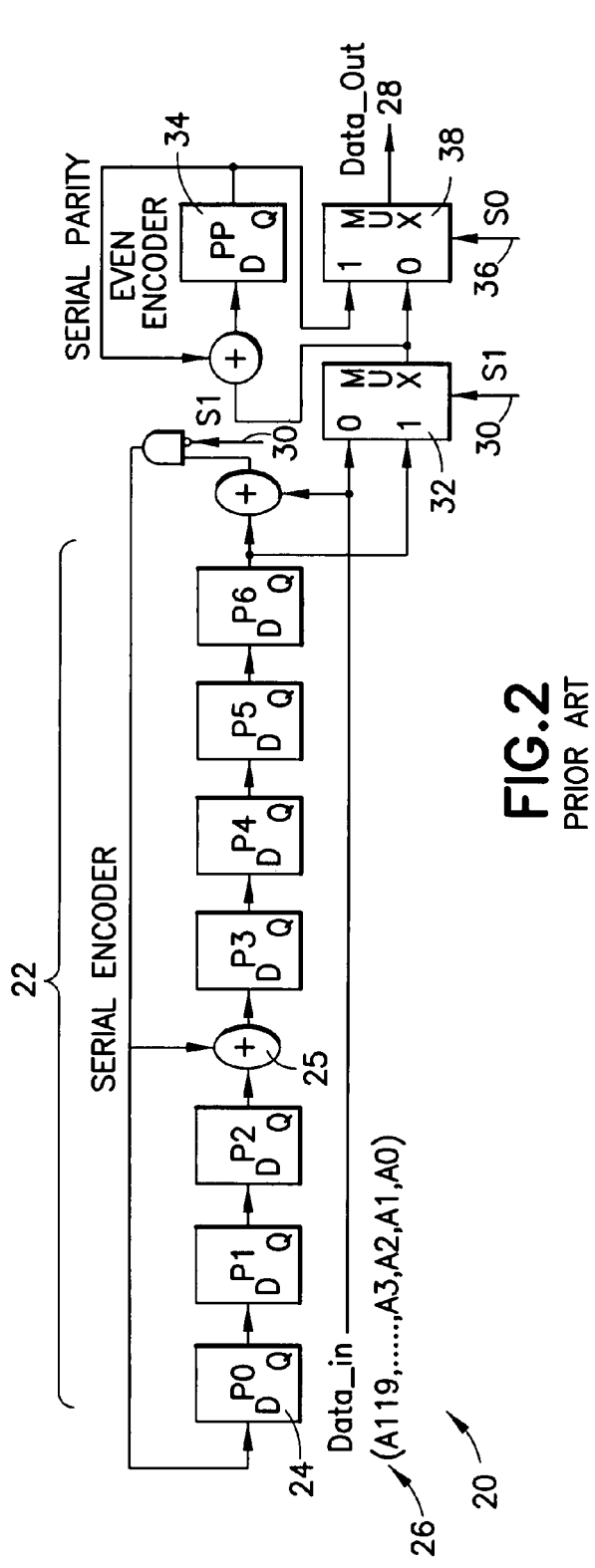
FIG. 2 is prior art schematic diagram of a TPC row encoder with one-bit registers to generate eight parity bits for each row codeword.

Consider the next state columns of FIG. 5 in view of the row encoder of FIG. 2. At a first subsequent state 104 or clock pulse, the first information bit is input and added to the output of register G, so register A carries the value P6+A0. Simultaneously, the sum P6+A0 is added at the adder 24 to the value P2, so the value P2+P6+A0 is input to accumulator D. The value in all other accumulators is merely shifted from that previous in the accumulator series of FIG. 2. This next state 104 represents the hardware of FIG. 2, where m=1. At a second subsequent state 106 upon the next clock pulse, the next information bit A1 is input from the Data in line 26. The input to accumulator A is then P5+A1, since P5 shifted out of accumulator G. The input to accumulator D is P1+P5+A1, since P1 shifted from its previous position in accumulator C. Similar progress can be followed for a third subsequent state 108, a fourth subsequent state 110, and so on. While FIG. 5 only illustrates m=4, further increases in LOP can be achieved by extending it. The inventors have specifically designed up to m=8, and further increases in LOP are readily achievable from these teachings.

Figure 3:
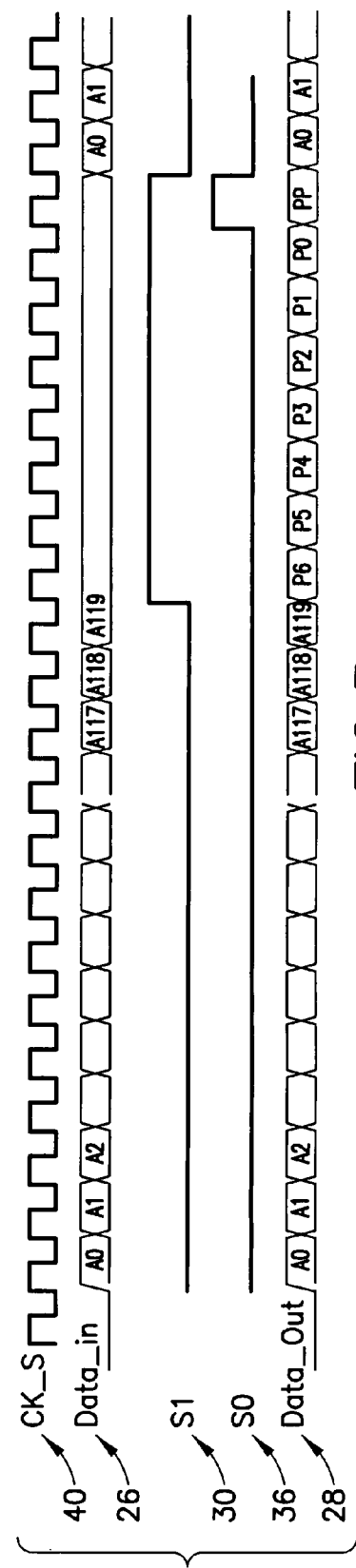
FIG. 3 is a timing diagram showing generation of a (128, 120) codeword using the TPC row encoder of FIG. 2 with one bit at a time processing.

FIG. 5 shows that the future states 106, 108, 110 of the accumulators A-G may be known in advance of one clock cycle 104. Therefore, LOP>1 can be implemented with a parallel arrangement of accumulators different from the linear arrangement of the accumulators 24 shown in FIG. 2. FIG. 5 shows the arrangement of the accumulators. For example, at the fourth column 108 where m=3, we see that three accumulators A, B and C have parallel inputs of an information bit and an output of another accumulator, and another three accumulators D, E and F having parallel inputs of an information bit and outputs of two other accumulators. Only accumulator G has an input from a single accumulator output similar to the arrangement of each accumulator (except P0) of FIG. 2. It is the novel arrangement of accumulators seen by example at FIG. 5 that enables the m-bit per clock cycle processing in the row encoder. As will be shown at FIG. 7, this new parallel architecture need not use any more accumulators than used in the serial processing of FIG. 2. In FIG. 7, the accumulators are not shown as interconnected so as not to obscure clarity, but outputs P0, P1, P2, P3, etc from a particular accumulator represents the same designated input P0, P1, P2, P3, etc to another accumulator as indicated there. Recall that FIG. 3 showed one bit at a time processing for the LFSR architecture of FIG. 2. Parallel processing necessarily increases data throughput, dependent on the level of parallelism.

Figure 6:
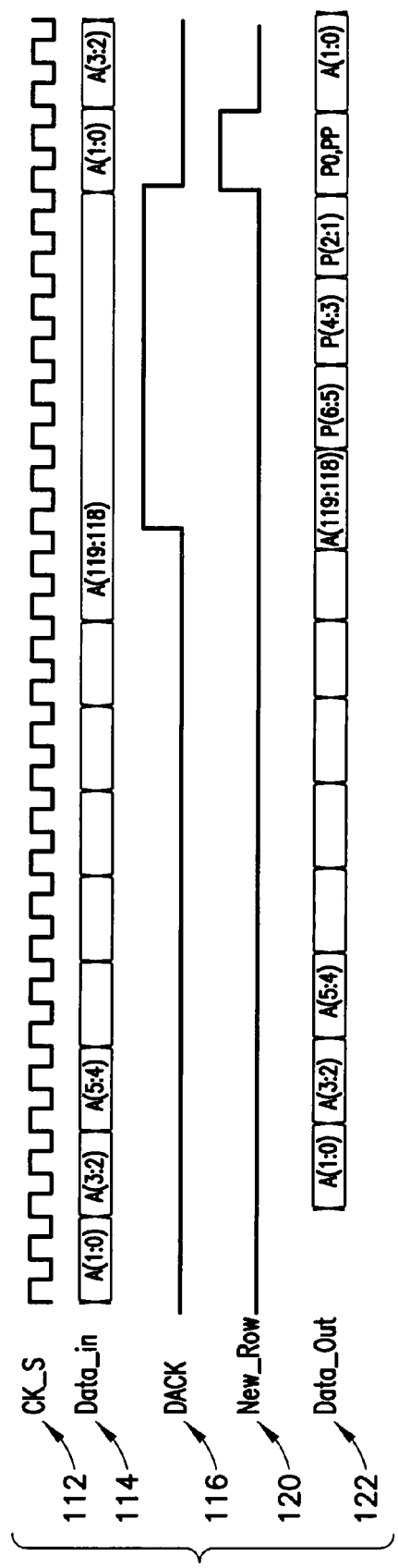
FIG. 6 is similar to FIG. 3, but showing timing for processing two bits at a time according to an embodiment of the invention.

FIG. 6 shows the resulting timing diagram for a LOP=2 implementation of a row encoder according to an embodiment of the invention. Data throughout is increased by almost a factor of two as compared to the one-bit at a time architecture of FIG. 3. In the embodiment of FIG. 6, the state of the LFSR is advanced by m=2 states or cycles when m=2 bits of data are fed to the LFSR at any single clock cycle. As can be seen, two information bits are input on the Data_in line 114 for each cycle of the clock signal 112, until a DACK signal 116 terminates input of the information bits while the parity bits are being appended to form the row codeword.

According to FIG. 6, a single row encoder processes (m=2) two information bits per clock cycle. There are also (m=2) two column encoders, each processing one bit per clock cycle. The same information bits input to the row encoder are simultaneously input to the two column encoders. This allows the Data_out line 122 to match the Data-in line 114 at two bits per cycle. The arrangement of row and column encoders is detailed more particularly below with respect to FIG. 11.

Note that DACK in FIG. 6 is low-enabled; when high, there is a suspension of bits input on the Data_in line 114. A row-count RCT signal 118 counts the number of rows of information bits processed by the row encoder, here beginning with the first row. A New_Row signal 120 acts to reset the accumulators A-G to zero, and corresponds to the signal on the DACK line 116 transitioning from high (disable) to low (enable). The New_Row signal 120 also enables output of the parity on parity bit PP from the accumulator that operates separately from the others (similar to that shown in FIG. 2) while the first information bit of the next row moves through the hardware. The Data_out line 122 outputs two bits per clock cycle.

ROW ENCODING: FIG. 7 illustrates an implementation of the accumulators to achieve the m=2 parallel processing seen at the third column 106 of FIG. 5. As can be seen from FIG. 5, any number m of parallelism may be achieved. The accumulators designed A, B, C, . . . etc. corresponds to the various rows of FIG. 5. Note that for each accumulator A-G, the inputs at FIG. 7 match the inputs seen at the m=2 column 106 of FIG. 5. By coupling the outputs of FIG. 7 to the corresponding inputs, a parallel architecture is achieved while using the exact same number of registers as was used in the one-bit processing serial architecture of FIG. 2. This might still be considered a linear feedback shift register LSFR though because values shift linearly from one accumulator to another, however the different input and output couplings allow more than one bit to be processed in a single clock cycle. The row encoder of FIG. 7 is shown as a block at FIG. 11 with reference number 125.

The New_Row signal 120 is seen in the timing diagram of FIG. 6. At the beginning of a new codeword, the New_Row signal 120 is asserted High in this example for one clock cycle, which causes the accumulators A through H to ignore the old values of (P6→P0) and PP and change their states based on the new arriving A1 and A0 data bits. The New_Row signal 120 should be generated at the correct times for shortened and non-shortened rows (detailed below). A New_code signal is used as a reset signal to emulate the resetting the contents of LFSR and PP parity registers to zero at the beginning of each new row code.

The Go_n signal 124 is a row encoder enable signal, which is active low in the example. After receiving all information bits of one row, the Go_n signal 124 is set high since during this time the encoder 100 should stop encoding and simply provide the generated parity check bits to the outside or memory module for storage.

Figure 11:
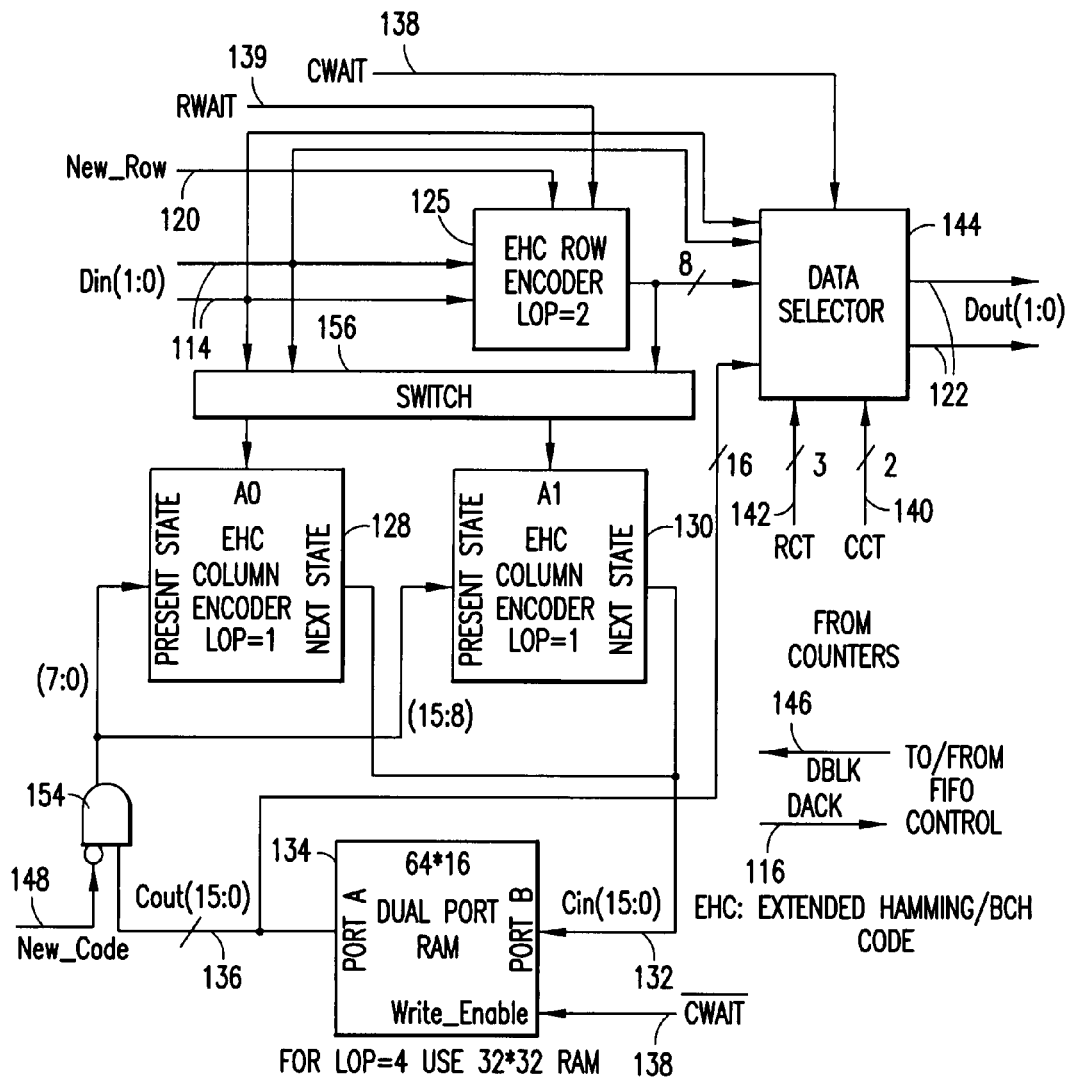
FIG. 11 is a schematic block diagram showing major components internal to the encoder of FIG. 4.

COLUMN ENCODING: The column encoding is implemented in hardware not unlike the row encoder shown in FIG. 2, with one major exception. For a LOP=2 encoder, the corresponding column encoding is implemented in m=2 parallel one-bit at a time column encoders, each operating on one column so as to match in time the single two-bit at a time row encoder of the overall BCH encoder. The overall encoding parallelism is then m=2. The column encoders are non-clocked, and as above may be implemented (like FIG. 2) as simply the next state decoder for an extended BCH code. However, since they operate in parallel with the row encoder, their interim output is temporarily stored in a local memory and fed back to the column encoders for further (interim or final) computation of the parity bits. Portions of the column encoders 128, 130 are shown in FIG. 11. The column encoders 128, 130 receive the present state values through a signal Cout 136 (7:0 and 15:8) from a memory module 130 (random access memory RAM in FIG. 11), receive single input information bits A0, A1, . . . from the Data_in line 114, and produces the next state of CM 132 (combined as 15:0) to be stored in the memory module 134. TAP values of the LFSR are provided through TAP (6:0; see FIG. 4), since the extended parity bit PP is calculated separately. For the case of $(128,120)^2$ code, Cin 132 and Cout 136 both are 8-bits data and TAP is 7 bits. The length of the TAP is provided in FIG. 4 as the TAP signal 101. To enable the encoding operation, an 'EWAIT' signal (encode-wait) is activated LOW in this example. The generic EWAIT signal is detailed below as CWAIT 138 (column wait) and RWAIT 139 (row wait) for column and row encoding enable signals. The column encoding process is disabled during the clock cycles that column parity bits and Parity-on-Parity bits are transmitted out of the encoder 100, when the New_code signal is ignored. Details of the timing control signal are detailed further below.

Continuing with description of the column encoding process and the example (128, 120) codeword, the New_code signal 148 is high during the first 128/2=64 cycles of a new codeword. As will be detailed further below, the column code parity bits are generated partially, as data arrives, and are stored in a memory module 134. At the beginning of a new codeword, instead of resetting the memory module to zero, the signal New_code 148 is used to force the input data to the column encoders 128, 130 to zero, equivalently. A column encoding process according to an embodiment of this invention includes m=2 column encoders 128, 130 operating in parallel for LOP=2. Therefore for the example (128,120) encoder and for the first 128/2=64 cycles, the New_code signal 148 is set to one for both shortened and non-shortened cases.

ROW AND COLUMN COUNTERS: A timing and control circuit is now detailed to control the operation of the row 125 and column 128, 130 encoders, as well as to control multiplexing the information bits and parity bits for output from the encoder module 100. Preliminary to describing that control circuitry is a description of the nature of arrival of the row and column codeword information data. Consider the example (128,120)(128,120) code. First, 120 bits of information bits A0, A1, . . . A119 arrives as the first row codeword. The information source at this point needs to be stopped from sending more data, since at this time the encoder 100 should send out 8 parity bits generated by the row encoder 125. During these first 128 bits of the first row, the New_code signal 148 is set high so as to reset the column encoders 128, 130. After completing sending the eight generated parity check bits, the source is allowed to send the next 120 bits of data as the second row of information bits to the encoder 100. At the start of receiving each new row, a New-Row signal 120 should be generated in order to reset the LFSR accumulators A-H (FIG. 7) used in the row encoder 125. This sequence is repeated until all of the 120 rows of information bits have been entered to the encoder 100. At this stage, the request is sent to the source to stop sending new data to the encoder 100 while the encoder 100 starts sending out the 128*8 column parity bits $P_V$ in the required order. That is, the column parity bits $P_V$ are generated on the already-received 120*120 information bits received into the row encoder 125.

Recall that in this example for the novel encoder, row encoding is performed with one row encoder 125 with LOP=2, and the column encoding is performed with two column encoders 128, 130 each with LOP=1. In addition the column encoders 128, 130 also perform the parity on parity operation (the $P_{VH}$ values of FIG. 1), though this function can readily be implemented by the row encoders with some adaptation to the specific example detailed herein. For the shortened $(128,120)^2$ code, the total number of rows is 127 and during the first shortened row the length of the codeword is 128−28=100. The specific number of shortened rows is provided in the short_row signal 103 of FIG. 4 and set equal to one, and the number of bits shortened is provided in the short_bits signal 105 of FIG. 4 and set equal to fourteen in this example.

Figures 8, 9:
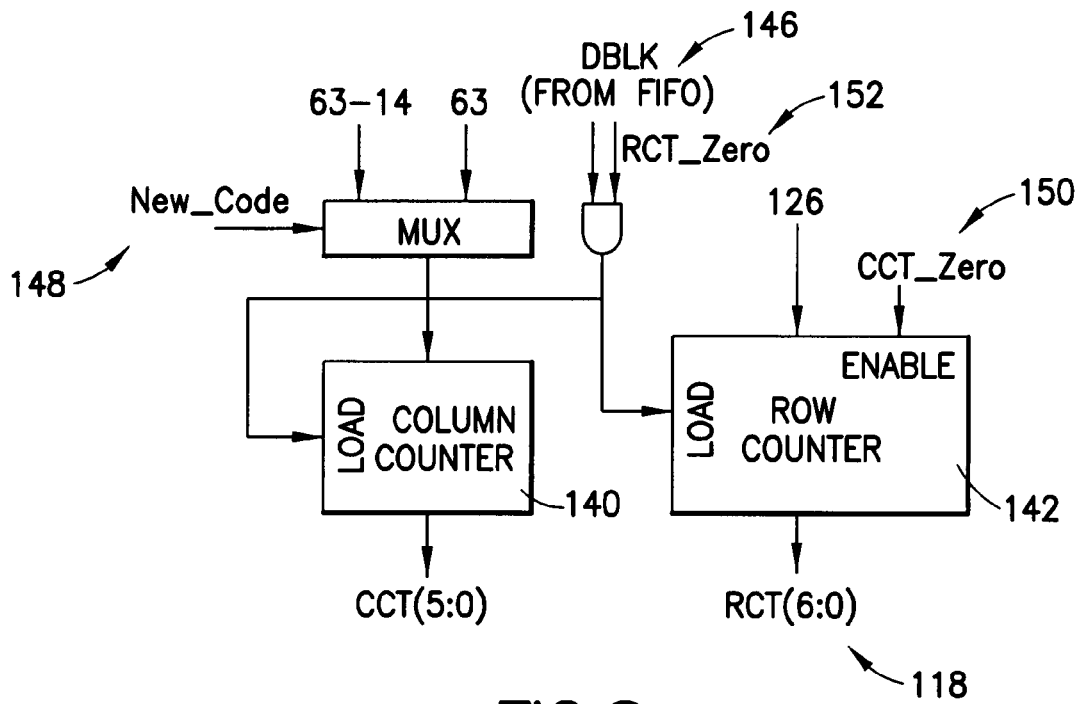
FIG. 8 is a schematic diagram showing row and column counters for controlling timing among the row and column encoders according to an embodiment of the invention.
FIG. 9 is a table of timing signals and their interrelation according to an embodiment of the invention.

Two counters 140, 142 are arranged in a cascade in the encoder's 100 timing and control circuitry shown in FIG. 8, and described as counting for the specific $(128, 120)^2$ code with LOP=2 architecture used by example herein. The output of these counters 140, 142 are used to control multiplexing the information bits with the various parity bits $P_V$, $P_H$ and $P_{VH}$ at a data selector 144 shown in FIG. 11. The first counter, termed a Column Counter CCT 140 (5:0) is initialized [with 63−0.5*(shortened bits)=(63−14)=49] during arrival of the first row, and then initialized to 63 afterwards. At the terminal count to zero of this column counter 140, a row counter RCT 142 is enabled to count down by one. A signal 118 from the row counter was shown in FIG. 6. The row counter RCT 142 (6:0) is initialized with 127−1=126 and counts down to zero (127 counts). Since the row encoder 125 operates with LOP=2, the column counter 140 requires 128/2=64 cycles per non-shortened row and (128-28)/2=50 cycles for the shortened row. However, the counter that counts the number of received rows operates with LOP=1 and hence the ROW Counter counts from 126 (rather than from 127 since the first row is shortened to length 100) down to 0. These two counters are initialized when the encoder receives a DBLK signal 146 from a first-in first-out memory FIFO indicating the beginning of a new codeword.

The associated control signals of RWAIT 139, CWAIT 138, EOB 148 (end of block), New-Row 120, New-code 148, and DACK 116 are generated according to FIG. 9. When the column counter 140 is 49 or 63, the New row signal 120 is high for one clock cycle, clearing the values in the parity accumulators P6-P0 for the next row encoding process. The New_code signal 148 is set to high when either the row counter RCT 142 is 126 or when the row counter RCT 142 equals 125 and the column counter CCT 140 is less than 14, forcing the input to the column encoders to zero. A CCT zero signal 150 and a RCT zero signal 152 are high when the CCT 140 count has counted down to zero and when the RCT 142 count has counted down to zero, respectively, to reset those counters 140, 142. The RWAIT signal 139 is high when the count of the CCT 140 is less than four, to suspend further input of information bits while four parity bits are generated and output by each of the two column encoders 128, 130. The CWAIT signal 138 is high when the count of the RCT 142 is less than eight, to suspend column encoding when the row encoder 125 is generating its eight parity bits for that row. The EOB signal 146 resets the entire encoder 100 after the entire TPC block is generated.

Figure 10:
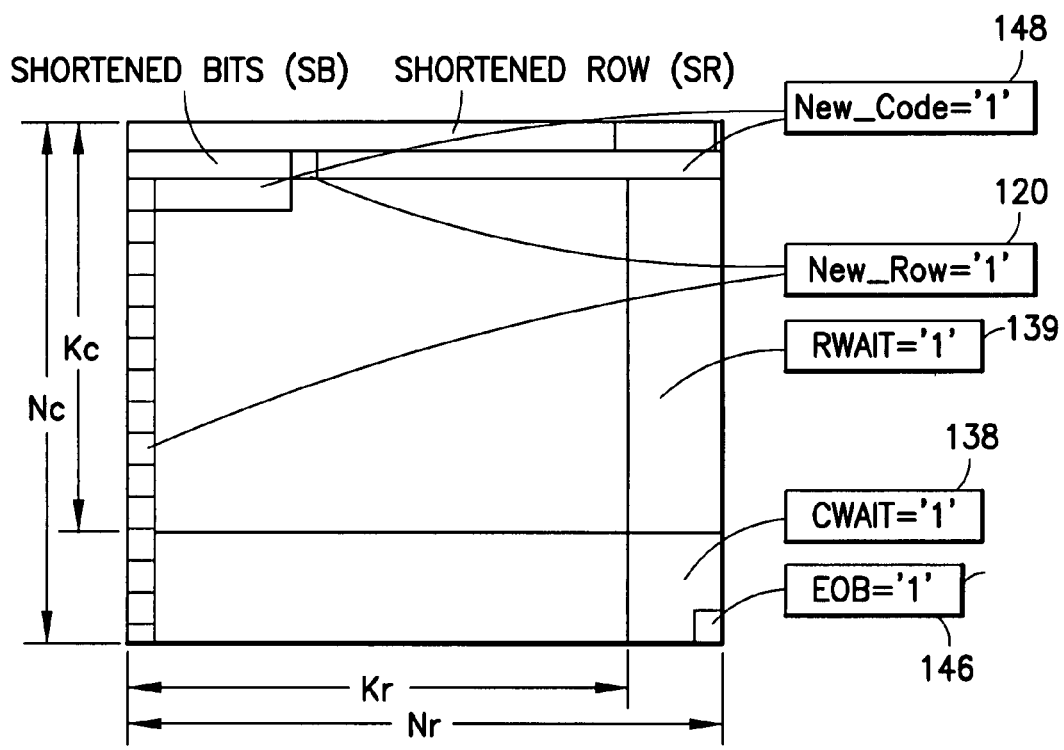
FIG. 10 is a schematic view of a full TPC code showing application of the various timing signals of FIG. 9.

Timing for the arrival of the data/information bits and generation/application of the control signals of FIG. 9 are shown in FIG. 10 in relation to the overall TPC block. The DACK signal 116 (FIGS. 4, 6 and 11) is used by the source of the information bits to control transfer of data from an input FIFO to the encoder 100. The DACK signal 116 is LOW during transmitting the row code and column code parity bits in this embodiment. In other words, the encoder 100 accepts new data only when DACK is HIGH.

INTERACTION OF ROW AND COLUMN ENCODERS: Consider FIG. 10. With the two-dimensional TPC codes, there exist an integer number Nc of entries (bits) in each column codeword. For any single TPC block, each column codeword includes Nc−Kc parity bits, where Nc−Kc−1 bits are generated by an LFSR (such as shown in FIG. 2 adapted to the length necessary for the FIG. 7 row encoder), and one bit generated by the extended parity (such as shown in FIG. 2). With a serial single bit at a time situation as detailed above for the column encoders 128, 130, due to the nature of arrival of data each of these column encoders 128, 130 receive their input bit every Nc clock cycles.

One implementation choice is to use Nc number of bit-serial column encoders and feed each of these encoders every Nc clock cycles. Another implementation option is to store the received block of information bits and after the completion of the entire row encoding process for all information bits, read the contents of the memory one column at a time and apply the output to a single bit-serial column encoder, iteratively for each column of information bits as well as the row-generated parity bits $P_H$.

One particularly elegant implementation of this invention uses neither of those above approaches for column encoding. With a serial 2-bit at a time architecture of the row encoder, only two independent serial single-bit at a time column encoders 128, 130 operate simultaneously, and the output of both are stored in a memory 134. With a LOP=m design architecture, every Nc/m clock cycles, the contents of the memory 134 are read out and with the use of new arriving m data bits, the column encoding process is continued and the new partial values of the column parity bits are stored back in the memory 134. Term these partial values as interim parity bits. Except for the last iteration, the interim parity bits are not in the resulting TPC code that is output from the encoder module 100.

In this example the memory 134 is 2*(Nc−Kc) wide and (Nr−Kr) tall to store the column-generated parity bits (where the parity on parity bits $P_{VH}$ are also generated in the column encoders 128, 130). This particular design is seen to require the smallest memory size as compared to the alternatives noted above. For example, for the (128,120)(128,120) code and LOP=2, the size of memory equals 2*8×64=16×64 bits.

This small memory can be implemented with single dual-port Block RAM or distributed RAM. Above, Nc is the total number of bits in an encoded column, Kc is the number of information bits in a column, Nr is the total number of bits in an encoded row, and Kr is the number of information bits in a row.

To find the smallest memory size, divide each n-bit long row (where n=a+b, a being the number of information bits and b being the number of parity bits) into groups of m bits. Therefore, there are n/m such groups. For each of these groups, the column encoding creates m*c bits of preliminary column bits, where c is the number of FEC bits per column (assuming m independent parallel encoders, each ultimately producing a number c of column parity bits). Memory is needed for every group, so the total memory size is, at minimum, m*c*(n/m)=c*m.

To avoid possible conflicts in memory read and write operations, one pipeline delay is inserted. Therefore, at any cycle when memory location Z is being read, then memory location Z−1 is written to. When a new block of codeword arrives, the contents of the memory need to be reset to zero. An equivalent operation is used to achieve the same goal. The New-Code signal 148 performs this task, which is active high for the first Nc clock cycles of one encoder block as detailed in the example implementation above. Output of the memory module 134 is ANDed at a logic gate 154 with the inverse of this signal 148 before being fed to the column encoder modules 128, 130.

A block diagram of the encoder 100 showing interaction of the row encoder 125 with the two column encoders 128, 130 is shown in FIG. 11. Every clock cycle, a pair of data bits (A1, A0) arrives on the Data_in line 114 and is fed into one LOP=2 row encoder 125 as a pair, and is also fed into two LOP=1 column encoders 128, 130 as single inputs of A1 and A0. A1 is the first data among the (A1, A0) pair. Output of the row encoder 125 is connected to the data selector module 144, where the choice is made between the information data and parity bits to be sent out. The intermediate/interim values from the column encoders 128, 130 are read, modified and stored back in the memory 134. The output Cout 136 of the memory 134 is also connected to the data selector 144 for being multiplexed to the output ports at the appropriate time.

MEMORY MODULE: The memory module 134 is in this embodiment a dual port RAM that stores the partial results of the column parity bits from the column encoders 128, 130. Every row of the RAM 134 has 2*8=16 valid data for two consecutive columns. By using 18 bits wide memory, the same encoder 100 hardware can be used to encode a (256, 247) TPC code, which has 9 parity bits. The depth of the memory is 128/2=64, twice the required depth for the (128, 120) TPC code to facilitate the (256,247) code. To increase the data throughput of this memory module 134, simultaneous read and write operations at the same memory location is avoided as noted above. Registering the output of the column encoders 128, 130 provides a single pipeline delay. Therefore, a WRITE operation to one particular location of the memory module 134 is preceded by the READ operation to the same location by one clock cycle. The WRITE operation to the memory module 134 is disabled after receiving all the information bits in the column encoders 128, 130 and during the time period the column encoders 128, 130 are busy sending out the calculated column parity bits $P_V$ and parity on parity bits $P_{VH}$. A control signal from the counter module is used to control the WRITE operation, the RWAIT signal 139 detailed above.

It should be noted that the each row of the TPC code encoded by the row encoder 125 creates 8 parity bits ($P_H$).

These parity bits are also fed into the column encoders 128, 130 at the correct timing through Switch circuitry 156 shown in FIG. 11, which accounts for the depth of the memory module 134 being 64 deep.

Figure 12:
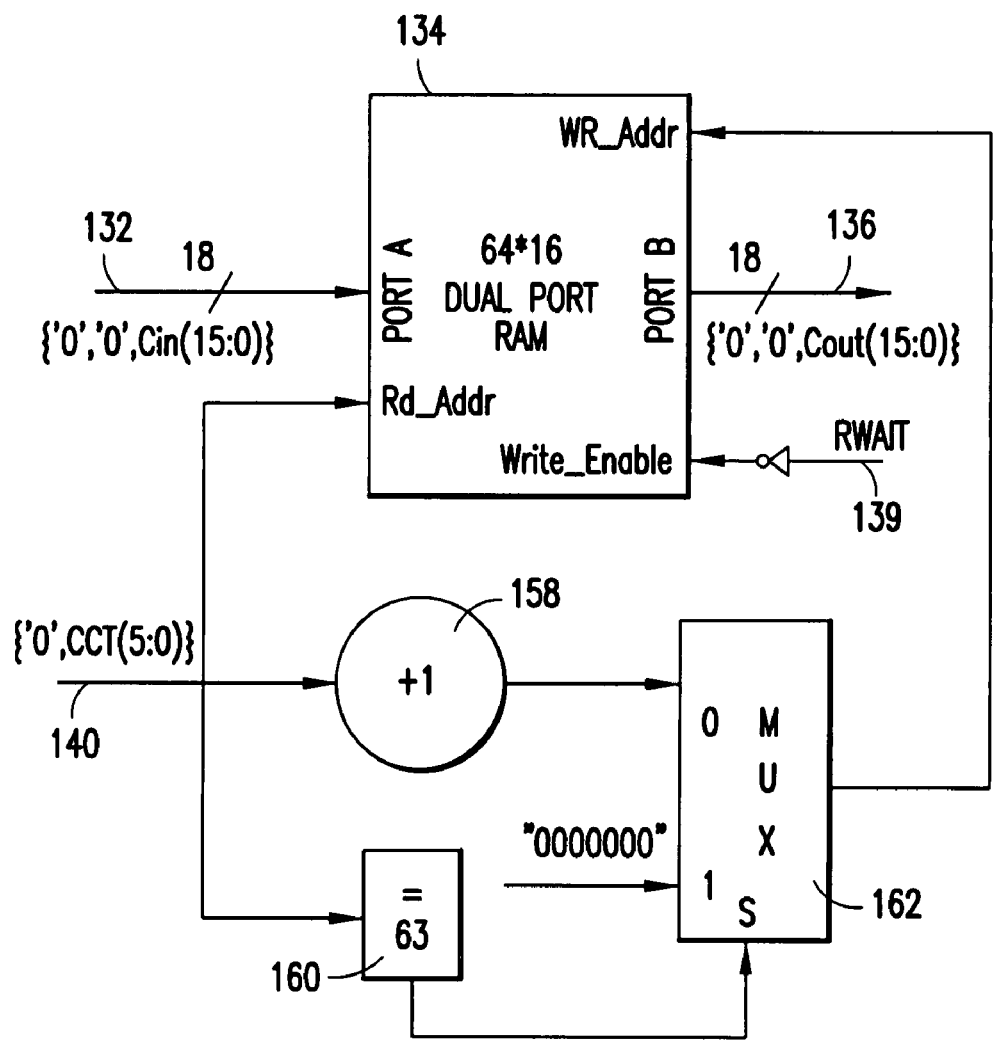
FIG. 12 is a schematic diagram showing further detail of the dual port RAM of FIG. 11.

Details of other circuitry associated with the memory module 134 are shown in the schematic diagram of FIG. 12, which enables the memory 134 to store the intermediate column parity bits. A count from the column counter 140 is incremented at an adder 158. If a comparator 160 finds the count equal to 63, a reset signal "0000000" is entered at a multiplexer 162 and the memory 134 is reset for the next TPC block. Otherwise the multiplexer 160 tracks the count of the present state for column encoding. The present state of the column encoders 128, 130 is input on the Cin line 132 and stored. That newly-stored present state is then output to those same column encoders 128, 130 on the Cout line 139 as detailed previously for computation of the next state, which is input at the Cin line 132 as the iteration continues. This operation is suspended by the RWAIT signal 139 as detailed above to allow the column encoders 128, 130 to finish computing the parity on parity bits $P_{VH}$.

Figure 13:
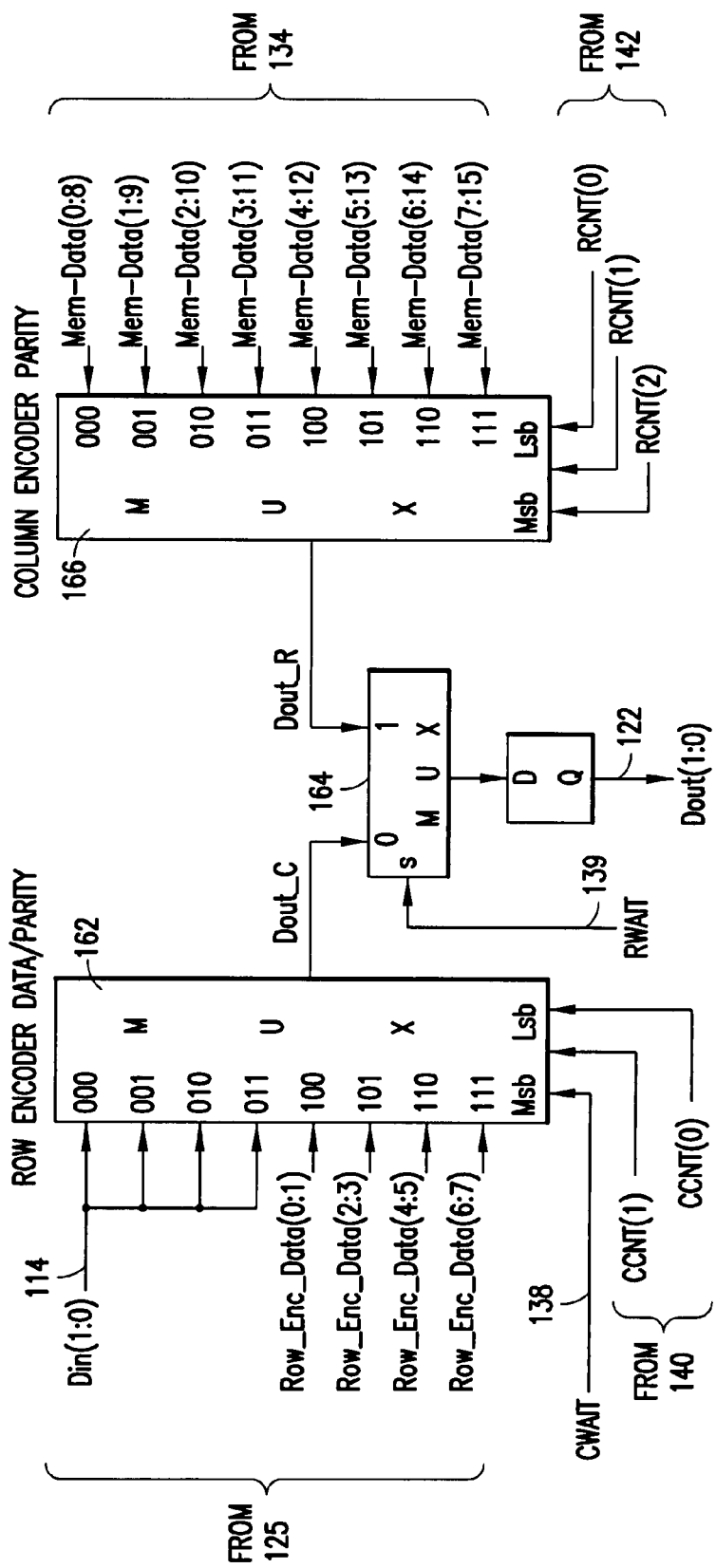
FIG. 13 is a schematic diagram showing further detail of the data selector/multiplexer of FIG. 11.

IO CONTROL MODULE: This module, shown as the data selector 144 in FIG. 11, is further detailed at FIG. 13. The JO control module 144 controls the output of the encoder 100 along the Data_out line 122 by multiplexing between the information bit input line Data_in 114, the output of the row encoder 125, and the outputs of the column encoders 128, 130 (which are stored in the memory module 134).

During the arrival of new row of data when the CWAIT signal 138 is zero/low, the output line Data_out 122 outputs those same information bits that are input to the row encoder 125 on the Data_in line 114. Following input of the last pair of information bits for a row, for 4 clock cycles at which the CWAIT signal is one/high, the output of the row encoder 125 is supplied to the Data_out line 122. The two least significant bits out of the column counter 140, i.e. the first pair of counts from the column counter 140, are used by a row-multiplexer 162 to split the 8-bit output of the row encoder 125 into four consecutive pairs. During arrival of information bits, which are fed to both the row encoder 125 and to the two column encoders 128, 130, the control signal RWAIT 139 is low/zero, enabling a R/C multiplexer 164 to allow only bits from the row multiplexer 162 to be output on the Data_out line 122 from the encoder 100.

After completion of arrival of all information bits for all rows, the control signal RWAIT 139 is asserted high/one, which switches the R/C multiplexer 164 to allow only bits from a column multiplexer 166 to pass out of the encoder on the Data_out line 122. These are the column parity bits $P_V$ and parity on parity bits $P_{VH}$, generated at the column encoders 128, 130 and stored in the memory module 134. For the $(128,120)^2$ code, the two parallel bit-serial column encoder outputs are stored in the memory as Mem_data(7:0) and Mem_data(15:8). The two most significant bits of memory, i.e. Mem_data(17:16) are unused.

The sequence of the parity bits sent out of the encoder 100 on the Data_out line 122 after the R/C multiplexer 164 switches from the row multiplexer 162 to the column multiplexer 166 (after all row codewords 0-119, each of length 128, are sent out) are as follows:

a) First, 128 parity bits of row number 120 (beginning the row count from zero) are sent out as 64 pairs. These include sixty pairs of column parity bits $P_V$ followed by four pairs of parity-on-parity bits $P_{VH}$.
 b) This is repeated for row numbers 121 to 127.
 c) Row number 120 contains the only most significant bit MSB of the column encoders 128, 130, and similarly the last row, i.e. row 127 contains the least significant bit LSB of the column encoders. The LSB is the extended parity (PP) bit of all the column encoders.
 d) The two least significant bits of the row counter 142, are used as an indicator of row numbers 120 to 127.

Figure 14:
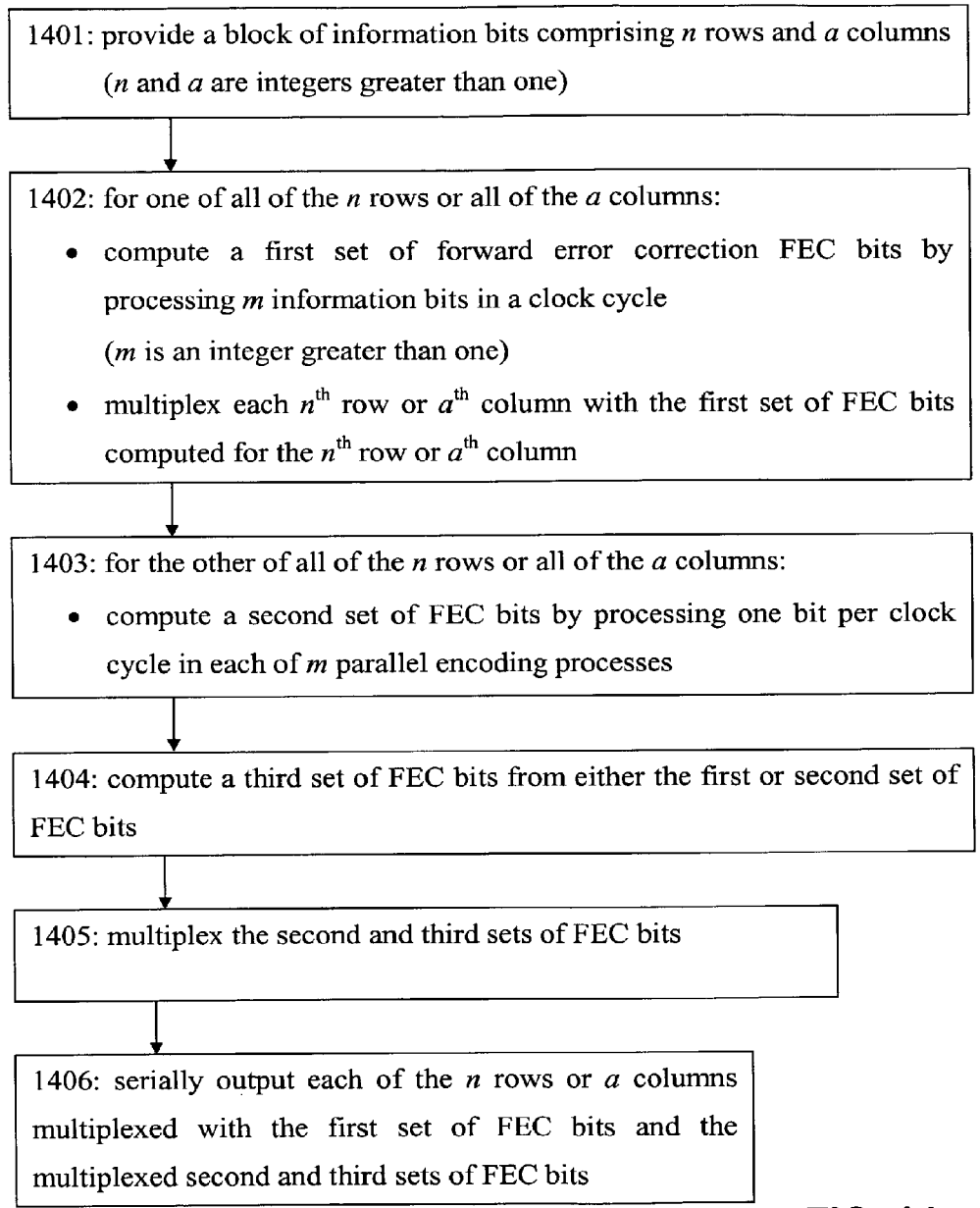
FIG. 14 is a logic flow diagram that illustrates the operation of a method for encoding information bits in accordance with an exemplary embodiment of this invention.

FIG. 14 is a logic flow diagram that illustrates process or method steps for encoding information bits. Consider an input series of n×a information bits. At block 1401 these are provided as a block of n rows and a columns. At block 1402, for one of all of the n rows or all of the a columns of the block, a first set of forward error correction FEC bits is computed by processing m information bits in a clock cycle, and each $n^{th}$ row or $a^{th}$ column is multiplexed with the first set of FEC bits computed for that $n^{th}$ row or $a^{th}$ column. At block 1403, for the other of all of the n rows or all of the a columns, a second set of FEC bits is computed by processing one bit per clock cycle in each of m parallel encoding processes. At block 1404 a third set of FEC bits is computed from either the first or second set of FEC bits, and at block 1405 the second and third sets of FEC bits are multiplexed. Then at block 1406 there is output serially each of the n rows or a columns multiplexed with the first set of FEC bits and the multiplexed second and third sets of FEC bits. As noted parenthetically within blocks 1401 and 1402, the terms n, a and m are integers greater than one.

The embodiments of this invention may be implemented by computer software executable by a data processor of a host device such as a portable radio, by hardware such as a processor or otherly termed integrated circuit (e.g., the encoding module 100), or by a combination of software and hardware.

The memory or memories may be of any type suitable to the local technical environment and may be implemented using any suitable data storage technology, such as semiconductor-based memory devices, magnetic memory devices and systems, optical memory devices and systems, fixed memory and removable memory. The data processor(s) may be of any type suitable to the local technical environment, and may include one or more of general purpose computers, special purpose computers, microprocessors, digital signal processors (DSPs) and processors based on a multi-core processor architecture, as non-limiting examples.

In general, the various embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Although described in the context of particular embodiments, it will be apparent to those skilled in the art that a number of modifications and various changes to these teachings may occur. Thus, while the invention has been particularly shown and described with respect to one or more embodiments thereof, it will be understood by those skilled in the art that certain modifications or changes may be made therein without departing from the scope and spirit of the invention as set forth above, or from the scope of the ensuing claims.

What is claimed is:

1. A method for encoding information bits comprising:
   providing a block of information bits comprising n rows and a columns;
   for one of all of the n rows or all of the a columns:
      computing by an encoder a first set of forward error correction FEC bits by processing m information bits in a clock cycle;
      multiplexing each $n^{th}$ row or $a^{th}$ column with the first set of FEC bits computed for the $n^{th}$ row or $a^{th}$ column;
   for the other of all of the n rows or all of the a columns:
      computing by the encoder a second set of FEC bits by processing one bit per clock cycle in each of m parallel encoding processes;
   computing by the encoder a third set of FEC bits from either the first or second set of FEC bits;
   multiplexing the second and third sets of FEC bits; and
   serially outputting from the encoder each of the n rows or a columns multiplexed with the first set of FEC bits and the multiplexed second and third sets of FEC bits;
   wherein n, a and m are integers greater than one.

2. The method of claim 1, wherein processing m information bits per clock cycle comprises processing through a row or column encoder comprising at least one accumulator having parallel inputs from at least two other accumulators.

3. The method of claim 1, wherein computing the first set of FEC bits and computing the second set of FEC bits are parallel processes.

4. The method of claim 3, where on each m clock cycles m information bits are input to a first encoder for computing the first set of FEC bits and different ones of the m information bits are input to different ones of the m second encoders for computing the second set of FEC bits.

5. The method of claim 1, wherein m is selected from the group two, four, eight and sixteen.

6. The method of claim 1, wherein computing the second set of FEC bits by processing one bit per clock cycle in each of m parallel encoding processes comprises, for each of the m parallel encoding processes:
   computing an interim FEC bit and outputting the interim FEC bit to a local memory;
   computing a final FEC bit of the second set of FEC bits from the interim FEC bit fed back from the local memory.

7. The method of claim 6, wherein the size of the local memory does not exceed n*c, where there are c FEC bits per column.

8. The method of claim 1, wherein the first set of FEC bits comprises one of row parity bits $P_H$ or column parity bits $P_V$, the second set of FEC bits comprises the other of row parity bits $P_H$ or column parity bits $P_V$, and the third set of FEC bits comprises parity on parity bits $P_{HV}$ or $P_{VH}$.

9. An encoder comprising:
   a source controller having an output configured to output an n×a series of information bits as n separate rows each with a information bits;
   a row encoder having an input coupled to the source controller output, and configured, for each of the n rows, to compute a first set of forward error correction FEC bits by processing m information bits of a row in a clock cycle;
   a first multiplexer configured to multiplex each $n^{th}$ row of information bits with the first set of FEC bits for the $n^{th}$ row that are output by the row encoder;
   a plurality of m column encoders in parallel with one another, each coupled to the source controller output through a switch and configured, for each of the a columns, to compute a second set of FEC bits by each processing one bit per clock cycle, and to generate a third set of FEC bits from the second set of FEC bits;
   a local memory having an input coupled to outputs of the m column encoders and an output coupled to inputs of the m column encoders for storing and feeding back interim FEC bits and for storing the second and third sets of FEC bits;
   a second multiplexer having an input coupled to the output of the local memory configured to multiplex the second and third sets of FEC bits; and
   a third multiplexer having inputs coupled to outputs of the first and second multiplexers and configured to output serially each of the n rows multiplexed with the first set of FEC bits and the multiplexed second and third sets of FEC bits;
   wherein n, a and m are integers greater than one.

10. The encoder of claim 9, wherein the row encoder comprises at least one accumulator having parallel inputs from at least two other accumulators.

11. The encoder of claim 9, wherein each of the row encoder and the plurality of m column encoders operate in parallel with one another.

12. The encoder of claim 11, where on each m clock cycles m information bits are input to the row encoder for computing the first set of FEC bits and different ones of the m information bits are input to different ones of the m column encoders for computing the second set of FEC bits.

13. The encoder of claim 9, wherein m is selected from the group two, four, eight and sixteen.

14. The encoder of claim 9, wherein the size of the local memory does not exceed n*c, where there are c FEC bits per column.

15. The encoder of claim 9, wherein the first set of FEC bits comprises row parity bits $P_H$, the second set of FEC bits comprises column parity bits $P_V$, and the third set of FEC bits comprises parity on parity bits $P_{HV}$ or $P_{VH}$.

16. The encoder of claim 9 disposed on an integrated circuit.

17. An encoder comprising:
   a source controller for providing a block of n×a information bits as n separate rows each with a information bits;
   a row encoder having an input coupled to an output of the source controller and comprising a plurality of accumulators arranged to process m of the information bits in a clock cycle to generate row forward error correction FEC bits;
   at least one column encoder having an input coupled to an output of the source controller and arranged to generate column FEC bits in parallel with the row encoder; and
   a multiplexer coupled to outputs of the row and column encoders adapted to serially output a row of information bits corresponding to each of the n separate rows followed by a row of FEC bits corresponding to each of the n separate rows, followed by at least one further row of FEC bits generated by the column encoder.

18. The encoder of claim 17, wherein the accumulators of the row encoder are arranged such that:
   one accumulator comprises parallel inputs of an information bit and an output of a second accumulator; and another accumulator comprises parallel inputs of the information bit, the second accumulator and a third accumulator.

19. The encoder of claim 17, in which the at least one column encoder comprises m column encoders operating at one bit per clock cycle.

20. The encoder of claim 19, further comprising a switch disposed between the source controller and the m column encoders adapted to input one of the m information bits to one of the column encoders simultaneous with the same one of the m information bits being input to the row encoder.

21. The encoder of claim 20, wherein the switch further comprises an input coupled to an output of the row encoder.

22. The encoder of claim 19, wherein m=2 and the plurality of accumulators of the row encoder are arranged such that:
two of the accumulators comprises parallel inputs of an information bit and an output of another accumulator; and
two of the accumulators comprise parallel inputs of an information bit and outputs of two further accumulators.

23. The encoder of claim 19, wherein m=3 and the plurality of accumulators of the row encoder are arranged such that:
three of the accumulators comprises parallel inputs of an information bit and an output of another accumulator; and
three of the accumulators comprise parallel inputs of an information bit and outputs of two further accumulators.

24. The encoder of claim 19, wherein m=4 and the plurality of accumulators of the row encoder are arranged such that:
three of the accumulators comprise parallel inputs of an information bit and an output of another accumulator;
three of the accumulators comprise parallel inputs of an information bit and outputs of two further accumulators; and
one of the accumulators comprises parallel inputs of two information bits and outputs of two further accumulators.

* * * * *